United States Patent
Eng et al.

(10) Patent No.: US 7,538,359 B2
(45) Date of Patent: May 26, 2009

(54) BACKLIGHT INCLUDING SIDE-EMITTING SEMICONDUCTOR LIGHT EMITTING DEVICES

(75) Inventors: Gregory W. Eng, Fremont, CA (US); Serge Bierhuizen, Santa Rosa, CA (US); Gerard Harbers, Sunnyvale, CA (US); Kalil Kalantar, Tama (JP)

(73) Assignee: Philips Lumiled Lighting Company, LLC, San Jose, CA (US)

( * ) Notice: Subject to any disclaimer, the term of this patent is extended or adjusted under 35 U.S.C. 154(b) by 54 days.

(21) Appl. No.: 11/840,114

(22) Filed: Aug. 16, 2007

(65) Prior Publication Data
US 2009/0045420 A1 Feb. 19, 2009

(51) Int. Cl.
*H01L 33/00* (2006.01)
(52) U.S. Cl. ............... 257/98; 257/99; 257/E33.057; 257/E33.058; 257/E33.067
(58) Field of Classification Search ............. 257/98, 257/99, E33.057, E33.058, E33.067
See application file for complete search history.

(56) References Cited

U.S. PATENT DOCUMENTS

| | | | |
|---|---|---|---|
| 6,598,998 B2 | 7/2003 | West et al. | |
| 6,828,596 B2 | 12/2004 | Steigerwald et al. | |
| 6,876,008 B2 | 4/2005 | Bhat et al. | |
| 2005/0269582 A1 | 12/2005 | Mueller et al. | |
| 2007/0085105 A1* | 4/2007 | Beeson et al. | 257/100 |
| 2008/0308824 A1* | 12/2008 | Shchekin et al. | 257/98 |
| 2008/0315228 A1* | 12/2008 | Krames et al. | 257/98 |
| 2009/0045416 A1* | 2/2009 | Bierhuizen et al. | 257/88 |
| 2009/0046479 A1* | 2/2009 | Bierhuizen et al. | 362/612 |

OTHER PUBLICATIONS

Oleg B. Shchekin et al., "Low Profile Side Emitting LED," U.S. Appl. No. 11/423,419, filed Jun. 9, 2006, 21 pages including drawings.

* cited by examiner

*Primary Examiner*—Victor A Mandala
(74) *Attorney, Agent, or Firm*—Patent Law Group; Rachel V. Leiterman

(57) ABSTRACT

Individual side-emitting LEDs are separately positioned in a waveguide, or mounted together on a flexible mount then positioned together in a waveguide. As a result, the gap between each LED and the waveguide can be small, which may improve coupling of light from the LED into the waveguide. Since the LEDs are separately connected to the waveguide, or mounted on a flexible mount, stress to individual LEDs resulting from changes in the shape of the waveguide is reduced.

5 Claims, 6 Drawing Sheets

BACKLIGHT INCLUDING SIDE-EMITTING SEMICONDUCTOR LIGHT EMITTING DEVICES

BACKGROUND

1. Field of Invention

This invention relates to illumination devices using side-emitting LEDs.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. Often, an n-type region is deposited on the substrate, then a light emitting or active region is deposited on the n-type region, then a p-type region is deposited on the active region. The order of the layers may be reversed such that the p-type region is adjacent to the substrate.

One promising use of semiconductor light emitting devices is for backlights in liquid crystal displays (LCDs). LCDs are commonly used in cellular phones, personal digital assistants (PDAs), portable music players, laptop computers, desktop monitors, and television applications. One embodiment of the present invention deals with a color or monochrome, transmissive LCD that requires backlighting, where the backlight may use one or more LEDs emitting white or colored light. The LEDs are distinguished from laser diodes in that the LEDs emit incoherent light.

In many displays, particularly small displays such as for cell phones, it is important that the display and backlight be thin. Further, since such small displays are typically battery operated, it is important that the light from the LED be efficiently directed to the back surface of the LCD. It is also important that the light from the LED be substantially uniformly emitted by the backlight so as not to distort the brightness of an image displayed by the LCD.

SUMMARY

In accordance with embodiments of the invention, individual side-emitting LEDs are separately positioned in a waveguide, or mounted together on a flexible mount then positioned together in a waveguide. As a result, the gap between each LED and the waveguide can be small, which may improve coupling of light from the LED into the waveguide. Since the LEDs are separately connected to the waveguide, or mounted on a flexible mount, stress to individual LEDs resulting from changes in the shape of the waveguide due to manufacturing tolerances or during use is reduced.

In some embodiments, a side-emitting light emitting device is positioned in an opening in a first transparent member. The first transparent member is positioned in an opening in a second transparent member. The opening in the second transparent member may be a slot on the edge of the second transparent member. The first transparent member may be placed in the second transparent member by aligning an alignment feature on the edge of the first transparent member with a complimentary alignment feature on the edge of the slot in the second transparent member.

In some embodiments, a side-emitting light emitting device is attached to a mount. The light emitting device is positioned in an opening in a transparent member, and the mount is press fit into a groove in the transparent member.

DETAILED DESCRIPTION

Embodiments of the present invention include low profile side-emitting LEDs in conjunction with thin waveguide designs for providing a uniform backlight. A typical application for the invention is as a thin backlight in an LCD.

Figure 1:
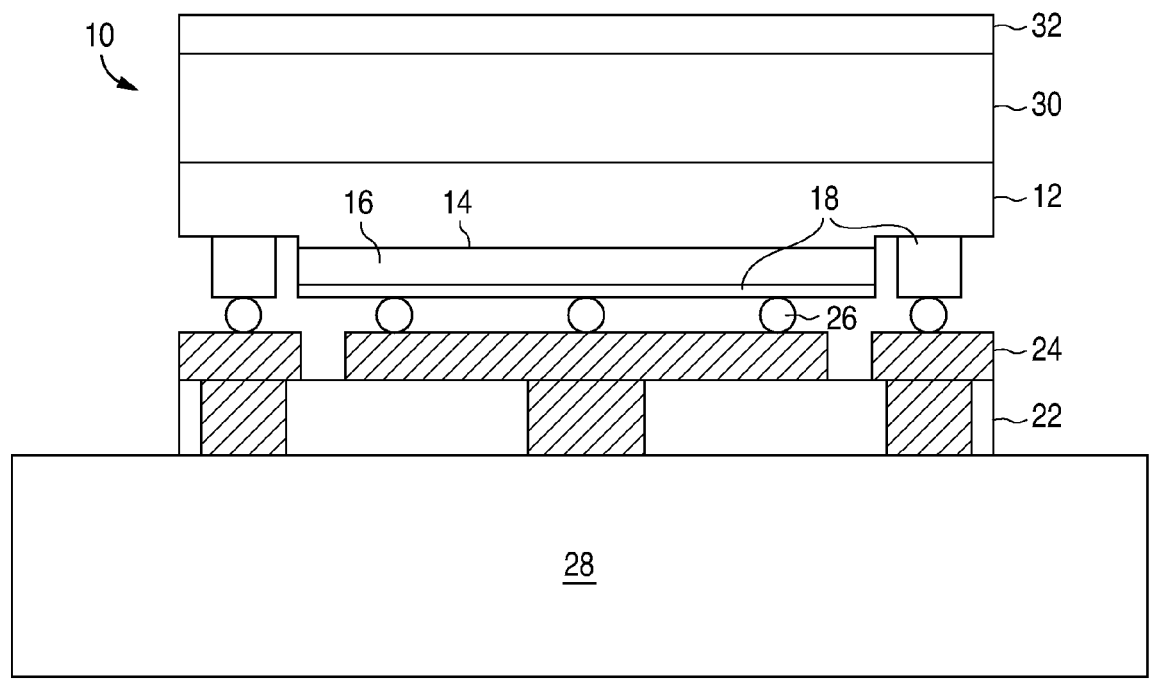
FIG. 1 is a cross-sectional view of a low profile, side-emitting LED in accordance with an embodiment of the invention.

FIG. 1 is a cross-sectional view of one embodiment of a thin, side-emitting LED 10. Other suitable embodiments of thin, side-emitting LEDs that may be used in the below-described embodiments can be found in U.S. application Ser. No. 11/423,419, entitled Low Profile Side Emitting LED, filed Jun. 9, 2006, by Oleg Shchekin et al., assigned to the present assignee, and incorporated herein by reference.

The active layer of the LED 10 in one example generates blue light. LED 10 is formed on a starting growth substrate, such as sapphire, SiC, or GaN. Generally, an n-layer 12 is grown followed by an active layer 14, followed by a p-layer 16. The p-layer 16 is etched to expose a portion of the underlying n-layer 14. Reflective metal electrodes 18 (e.g., silver, aluminum, or an alloy) are then formed over the surface of the LED to contact the n and p layers. When the diode is forward biased, the active layer 14 emits light whose wavelength is determined by the composition of the III-nitride active layer. Forming such LEDs is well known and need not be described in further detail. Additional detail of forming LEDs is described in U.S. Pat. No. 6,828,596 to Steigerwald et al. and U.S. Pat. No. 6,876,008 to Bhat et al., both assigned to the present assignee and incorporated herein by reference.

The semiconductor LED is then mounted on a mount 22 as a flip chip. The mount 22 contains metal electrodes 24 that are soldered or ultrasonically welded to the metal 18 on the LED via interconnects 26, which may be, for example, gold or solder. Interconnects 26 may be omitted if the electrodes themselves can be connected, for example by an ultrasonic weld or any other suitable joint.

The mount electrodes 24 are electrically connected by vias to pads on the bottom of the mount so the mount can be surface mounted to metal pads on a printed circuit board 28. Metal traces on the circuit board 28 electrically couple the pads to a power supply. The mount 22 may be formed of any suitable material, such as ceramic, silicon, aluminum, etc. If the mount material is conductive, an insulating layer is formed over the substrate material, and the metal electrode pattern is formed over the insulating layer. The mount 22 acts as a mechanical support, provides an electrical interface between the delicate n and p electrodes on the LED chip and a power supply, and provides heat sinking. Suitable mounts are well known.

To reduce the thickness of LED 10 and to prevent light from being absorbed by the growth substrate, the growth substrate is removed by a method suitable to the substrate, such as etching, chemical-mechanical polishing, or laser melting, where a laser heats the interface of the III-nitride structure and growth substrate, melting a portion of the III-nitride structure and releasing the substrate from the semiconductor structure. In one embodiment, removal of the growth substrate is performed after an array of LEDs are mounted on a submount wafer and prior to the LEDs/submounts being singulated (e.g., by sawing).

After the growth substrate is removed, in some embodiments the remaining III-nitride structure is thinned and/or roughened or patterned, for example with a photonic crystal. A substantially planar phosphor layer 30 is positioned over the top of the LED for wavelength-converting the blue light emitted from the active layer 14. The phosphor layer 30 may be preformed as a ceramic sheet and affixed to the LED layers, or the phosphor particles may be thin-film deposited, such as by electrophoresis. The light emitted by the phosphor layer 30, when mixed with blue light, creates white light or another desired color. For example, a blue-emitting LED may be combined with a single yellow-emitting phosphor, or with a red-emitting phosphor and a green-emitting phosphor. If a UV-emitting LED is used, a blue-emitting phosphor may be added. Phosphors emitting other colors of light may be added to achieve a desired color point of the mixed, white light.

Examples of phosphors that may be formed into luminescent ceramic layers include aluminum garnet phosphors with the general formula $(Lu_{1-x-y-a-b}Y_xGd_y)_3(Al_{1-z}Ga_z)_5O_{12}$:$Ce_aPr_b$ wherein $0<x<1$, $0<y<1$, $0<z\leq0.1$, $0<a\leq0.2$ and $0<b\leq0.1$, such as $Lu_3Al_5O_{12}$:$Ce^{3+}$ and $Y_3Al_5O_{12}$:$Ce^{3+}$ which emit light in the yellow-green range; and $(Sr_{1-x-y}Ba_xCa_y)_{2-z}Si_{5-a}Al_aN_{8-a}O_a$:$Eu_z^{2+}$ wherein $0\leq a<5$, $0<x\leq1$, $0\leq y\leq1$, and $0<z\leq1$ such as $Sr_2Si_5N_8$:$Eu^{2+}$, which emit light in the red range. Suitable $Y_3Al_5O_{12}$:$Ce^{3+}$ ceramic slabs may be purchased from Baikowski International Corporation of Charlotte, N.C. Other green-, yellow-, and red-emitting phosphors may also be suitable, including $(Sr_{1-a-b}Ca_bBa_c)Si_xN_yO_z$:$Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2$:$Eu^{2+}$; $(Sr_{1-u-v-x}Mg_uCa_vBa_x)(Ga_{2-y-z}Al_yIn_z S_4)$:$Eu^{2+}$ including, for example, $SrGa_2S_4$:$Eu^{2+}$; $Sr_{1-x}Ba_xSiO_4$:$Eu^{2+}$; and $(Ca_{1-x}Sr_x)S$:$Eu^{2+}$ wherein $0<x\leq1$ including, for example, CaS:$Eu^{2+}$ and SrS:$Eu^{2+}$.

A luminescent ceramic may be formed by heating a powder phosphor at high pressure until the surface of the phosphor particles begin to sinter together to form a rigid agglomerate of particles. Unlike a thin film, which optically behaves as a single, large phosphor particle with no optical discontinuities, a luminescent ceramic behaves as tightly packed individual phosphor particles, such that there are small optical discontinuities at the interface between different phosphor particles. Thus, luminescent ceramics are optically almost homogenous and have the same refractive index as the phosphor material forming the luminescent ceramic. Unlike a conformal phosphor layer or a phosphor layer disposed in a transparent material such as a resin, a luminescent ceramic generally requires no binder material (such as an organic resin or epoxy) other than the phosphor itself, such that there is very little space or material of a different refractive index between the individual phosphor particles. As a result, a luminescent ceramic is transparent or translucent, unlike a conformal phosphor layer. For more information related to a luminescent ceramic that may be used with the present invention, see U.S. Pub. No. 2005/0269582, which is incorporated herein by reference.

In one embodiment, the luminescent ceramic is eCAS, which is $Ca_{0.99}AlSiN_3$:$Eu_{0.01}$ synthesized from 5.436 g $Ca_3N_2$ (>98% purity), 4.099 g AlN (99%), 4.732 g $Si_3N_4$ (>98% purity) and 0.176 g $Eu_2O_3$ (99.99% purity). The powders are mixed by planetary ball milling, and fired for 4 hours at 1500° C. in $H_2/N_2$ (5/95%) atmosphere. The granulated powder is uniaxially pressed into pellets at 5 kN and cold isostatically pressed at 3200 bar. The pellets are sintered at 1600° C. in $H_2/N_2$ (5/95%) atmosphere for 4 hours. The resulting pellets display a closed porosity and are subsequently hot isostatically pressed at 2000 bar and 1700° C. to obtain dense ceramics with >98% of the theoretical density.

In one embodiment, the luminescent ceramic is BSSNE, which is $Ba_{2-x-z}M_xSi_{5-y}Al_yN_{8-y}O_y$:$Eu_z$ (M=Sr, Ca; $0\leq x\leq1$, $0\leq y\leq4$, $0.0005\leq z\leq0.05$). Firstly $Ba_{2-x-z}M_xSi_{5-y}Al_yN_{8-y}O_y$:$Eu_z$ (M=Sr, Ca; $0\leq x\leq1$, $0\leq y\leq4$, $0.0005\leq z\leq0.05$) is prepared in powder form, for example by carbothermal reduction, which includes mixing 60 g $BaCO_3$, 11.221 g $SrCO_3$ and 1.672 g $Eu_2O_3$ (all 99.99% purity) by planetary ball milling using 2-propanol as dispersing agent. After drying the mixture is fired in forming gas atmosphere at 1000° C. for 4 hours and 10 g of the thus obtained $Ba_{0.8}Sr_{0.2}O$:Eu (2%) are mixed with 5.846 g $Si_3N_4$ (>98% purity), 0.056 g AlN (99% purity) and 1.060 g graphite (microcrystal grade). The powders are thoroughly mixed by 20 min. planetary ball milling and fired for 4 hours at 1450° C. in forming gas atmosphere to obtain a precursor powder of $Ba_{2-x-z}M_xSi_{5-y}Al_yN_{8-y}O_y$:$Eu_z$ (M=Sr, Ca; $0\leq x\leq1$, $0\leq y\leq4$, $0.0005\leq z\leq0.05$). The powder is washed with HCl and milled again. The obtained precursor powder is then hot pressed at 1550° C. and 80 MPa yielding dense ceramic bodies. These are sliced, polished and diced to obtain the desired shape and optical surface properties. If necessary the ceramic can be annealed at 1300° C. in nitrogen to remove defects.

In one embodiment, the luminescent ceramic is SSONE, which is manufactured by mixing 80.36 g $SrCO_3$ (99.99% purity), 20.0 g $SiN_{4/3}$ (>98% purity) and 2.28 g $Eu_2O_3$ (99.99% purity) and firing at 1200° C. for 4 hour in a $N_2/H_2$ (93/7) atmosphere. After washing, the precursor powder is uniaxially pressed at 10 kN and subsequently cold isostatic pressed at 3200 bar. Sintering is typically done at temperatures between 1550° C. and 1580° C. under $H_2/N_2$ (5/95) or pure nitrogen atmosphere.

Returning to FIG. 1, a reflective film 32 is formed over the phosphor layer 30. The reflective film 32 may be specular or diffusing. A specular reflector may be a distributed Bragg reflector (DBR) formed of organic or inorganic layers. The specular reflector may also be a layer of aluminum or other reflective metal, or a combination of DBR and metal. A diffusing reflector may be formed of a metal deposited on a roughed surface or a diffusing material such as a suitable white paint. The phosphor layer 30 also helps to diffuse the light to improve light extraction efficiency.

In one embodiment, the mount 22 has a thickness of about 380 microns, the semiconductor layers have a combined thickness of about 5 microns, the phosphor layer 30 has a thickness of about 200 microns, and the reflective film 32 has a thickness of about 150 microns, so that the LED plus the mount is less than 1 mm thick. Of course, the LED 10 can be made thicker. The length of each side of the LED is typically less than 1 mm. Though the LEDs shown in the example are square, they may be any shape.

If the LED need not be ultra-thin, the efficiency of the side emission may be increased by adding a clear wave guiding layer over the n-layer 12, a scattering layer over the phosphor layer incorporating reflective particles or a roughed/prism surface, and a dichroic mirror or a one-way mirror below the phosphor layer 30 so that light downwardly reflected by the reflective film 32 is not absorbed by the semiconductor layers.

Side-emitting flip-chip LEDs provide a number of advantages when used in lighting systems. In backlights, side-emitting flip chip LEDs allow utilization of thinner waveguides, fewer LEDs, better illumination uniformity, and higher efficiency due to better coupling of light into a waveguide. One difficulty with side-emitting LEDs is that for best results, the LEDs are preferably placed within a waveguide. Any gap between each LED and the waveguide is preferably made as small as possible to avoid loss. If several LEDs are mounted on a rigid board then aligned with and placed in openings in the waveguide, it is difficult to achieve a small enough gap given common manufacturing tolerances. In addition, even if a small enough gap is achieved, changes to the shape of the waveguide, for example due to thermal cycling or mechanical flexing of a portable device, can exert stress on the LEDs which can cause failure.

In accordance with embodiments of the invention, individual LEDs are separately positioned in a waveguide, or mounted together on a flexible mount then positioned together in a waveguide. As a result, the gap between each LED and the waveguide can be small. Since the LEDs are separately connected to the waveguide, or mounted on a flexible mount, stress to individual LEDs resulting from changes in the shape of the waveguide is reduced.

Figure 2:
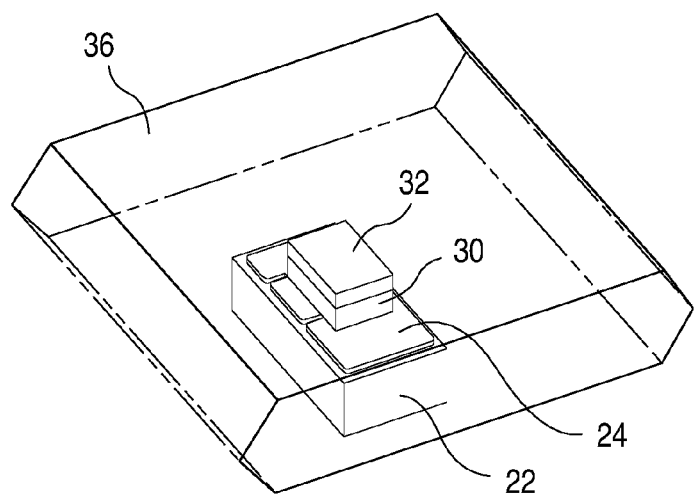
FIG. 2 illustrates a side-emitting LED positioned in a waveguide section.

In FIG. 2, a side-emitting LED 10, mounted on a mount 22, is positioned in an opening in a section of solid, transparent waveguide material 36. Waveguide section 36 may be, for example, acrylic (e.g., PMMA), hard silicone, molded plastic, polycarbonate, or any other suitable material. A mirror film (not shown) may cover the bottom of waveguide section 36. The film may be, for example, enhanced specular reflector (ESR) film available from 3M corporation.

Figure 3:
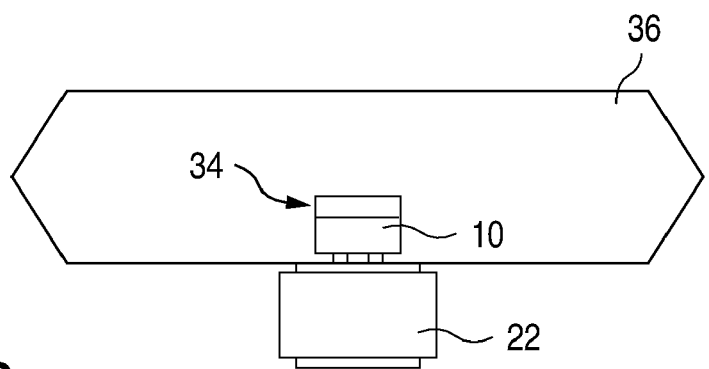
FIG. 3 is a cross-sectional view of a side-emitting LED positioned in a waveguide section.

FIG. 3 is a cross sectional view of the structure shown in FIG. 2. In the device illustrated in FIG. 3, opening 34 does not extend through the entire thickness of waveguide section 36, though in other embodiments it may. LED 10, which includes at least the semiconductor structure, phosphor layer, and reflector layer shown in FIG. 1, is disposed within waveguide section 36. Mount 22 extends below the bottom of waveguide section 36. An adhesive such as silicone or epoxy may be disposed between waveguide segment 36 and mount 22.

Waveguide section 36 is small, in some embodiments on the order of millimeters on a side. For example, the waveguide section shown in FIGS. 2 and 3 may be 3 mm by 3 mm in area, and less than 1 mm thick. LED 10 may be centered in waveguide section 36, as illustrated in FIGS. 2 and 3, though it need not be.

Figure 4:
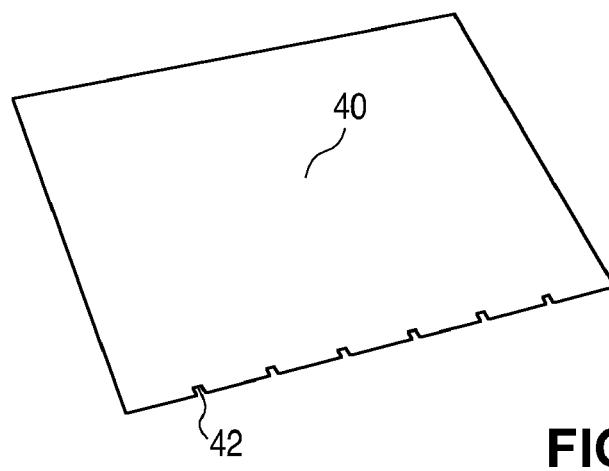
FIG. 4 is a plan view of a waveguide with slots for multiple waveguide sections.

Waveguide section 36 is designed to fit in a slot in a larger waveguide, as illustrated in FIG. 4. For example, as illustrated in FIG. 4, waveguide 40 may be large enough for a screen with a nine inch diagonal. Several slots 42 are disposed on an edge of waveguide 40. Each slot 42 can accommodate a waveguide section 36, as illustrated in FIGS. 2 and 3. Though six slots 42 are shown in FIG. 4, of course more or fewer slots may be used depending on the number of LEDs required, which depends on the size of the screen to be illuminated and the required brightness. The practical total thickness of waveguide 40 may be between 300-800 microns. A reflective film (not shown) may be disposed on the bottom of waveguide 40.

Figure 5:
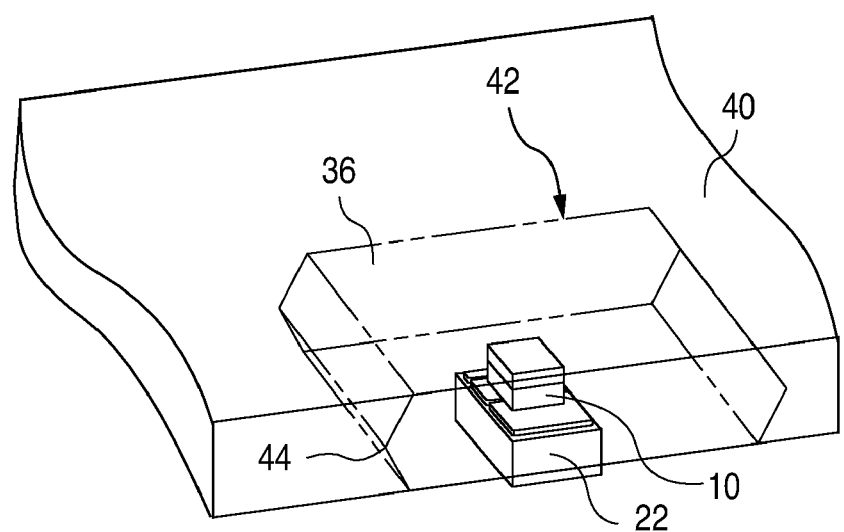
FIG. 5 is a perspective view of a waveguide section positioned in a waveguide.

FIG. 5 illustrates a waveguide section 36 positioned in slot 42 of a larger waveguide 40. Waveguide section 36 and waveguide 40 may be formed from the same material, though they need not be. When different materials are used, the materials that form waveguide section 36 and waveguide 40 are preferably selected to have reasonably close indices of refraction. Each waveguide section 36 may be separately connected to waveguide 40, such that changes to the shape of waveguide 40, for example from mechanical flexing or thermal cycling, do not stress individual LEDs.

Figure 6A:
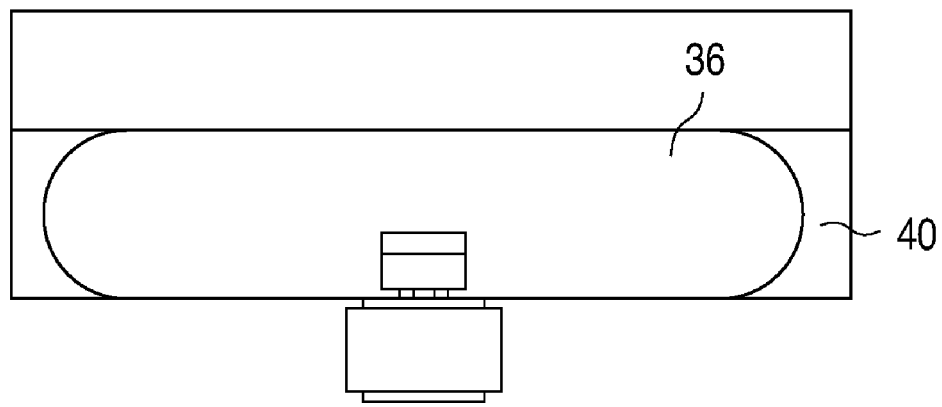
FIGS. 6A and 6B are cross sectional views of alternative alignment features for aligning a waveguide section with a larger waveguide.
Figure 6B:
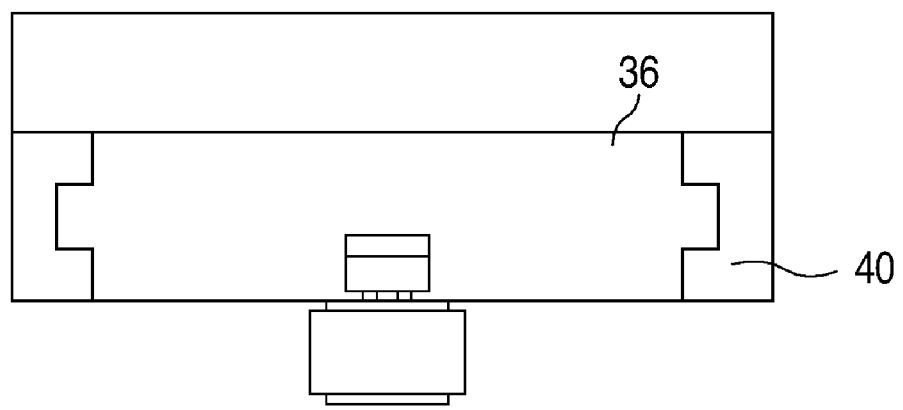

The sides of waveguide section 36 are shaped with an alignment feature and the sides of slot 42 are shaped with a complimentary alignment feature such that waveguide section 36 is self-aligned with slot 42. In FIG. 5, the alignment feature is a V-shaped edge on the side of waveguide section 36. FIGS. 6A and 6B illustrate different alignment features. In the device shown in FIG. 6A, the alignment feature is a semicircular edge. In the device shown in FIG. 6B, a tab is formed on the edge of wavelength section 36 that fits in a complementary notch formed on the edge of the slot in waveguide 40. Any suitable alignment feature may be used; FIGS. 5, 6A, and 6B merely illustrate examples. Light is emitted from LED 10 into waveguide section 36, then into waveguide 40.

In some embodiments, an adhesive such as silicone or epoxy is disposed between waveguide section 36 and larger waveguide 40. In addition to adhesive properties, the adhesive may be selected to be a close index of refraction match to waveguide section 36 and waveguide 40, in order to improve the coupling of light from waveguide section 36 into waveguide 40. In some embodiments, waveguide section 36 and larger waveguide 40 fit together such that there is no air gap between the two.

Figure 7:
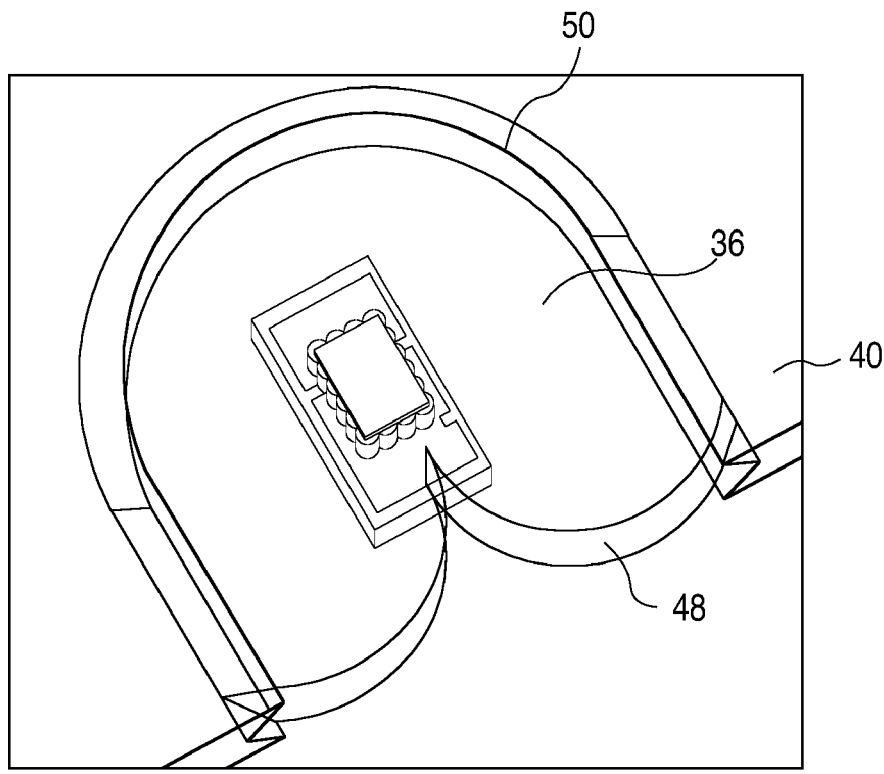
FIG. 7 is a perspective view of a waveguide section with a curved edge positioned in a waveguide.

The waveguide sections shown in FIGS. 2 and 5 are square. In the device illustrated in FIG. 7, waveguide section 36 has a curved edge 50 where waveguide section 36 fits in slot 42 of waveguide 40. Waveguide section 36 may also be curved on the edge 48 that forms the edge of the waveguide. Curved edge 50 may improve extraction of light from waveguide section 36 into waveguide 40. Curved edge 48 may create total internal reflection at the interface with air, reducing the amount of light lost from waveguide section 36 at edge 48.

Figure 8:
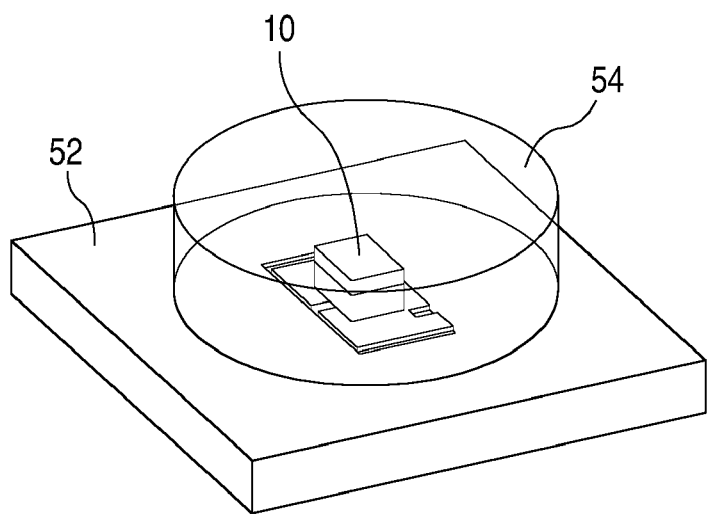
FIG. 8 illustrates a waveguide section including a reference surface.

FIG. 8 illustrates an alternative embodiment of a waveguide section. In the device illustrated in FIG. 8, LED 10 is mounted on or in a reference surface 52. Reference surface 52 may replace mount 22, or mount 22 may be mounted on reference surface 52. Reference surface 52 is preferably reflective and thermally conductive, to direct heat away from LED 10. A waveguide section 54 with an opening to accommodate LED 10 is positioned over reference surface 52. As illustrated in FIG. 8, reference surface 52 has a larger lateral extent than waveguide section 54. Reference surface 52 may be, for example, a heat conducting metal such as copper or a high temperature resistant plastic. Reference surface 52 may be coated with a reflective material such as aluminum or silver. The waveguide section illustrated in FIG. 8 is circular.

Figure 9:
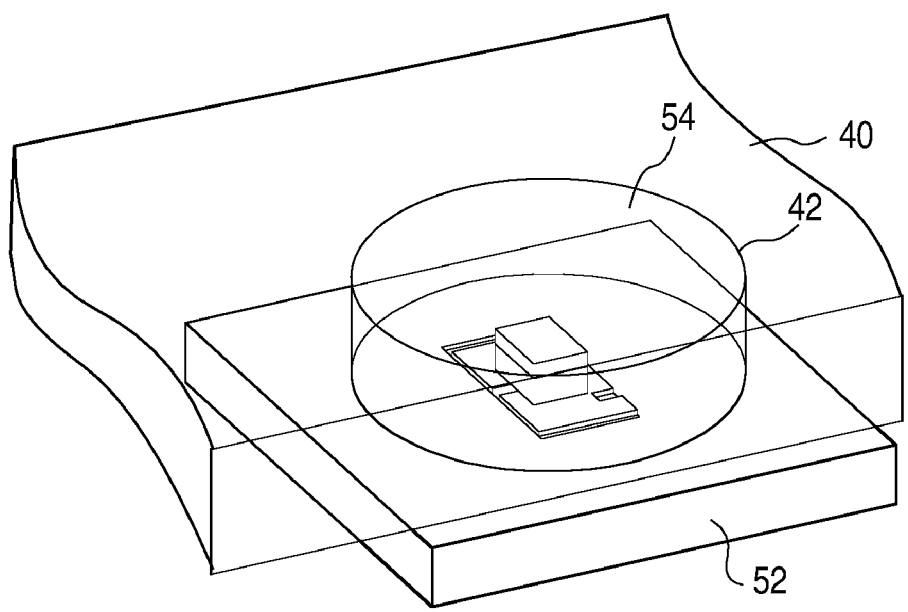
FIG. 9 illustrates the waveguide section of FIG. 8 inserted in a larger waveguide.

FIG. 9 illustrates the waveguide section of FIG. 8 placed in an opening 42 of a larger waveguide 40. Opening 42 may be slightly smaller than waveguide section 54, such that reference surface 52 presses against waveguide 40 when waveguide section 54 is placed in opening 42. Waveguide section 54 may be attached to waveguide 40 by a tension fit with waveguide 40, or an adhesive may be disposed between waveguide section 54 and waveguide 40, or between waveguide 40 and reference surface 52.

Figure 10:
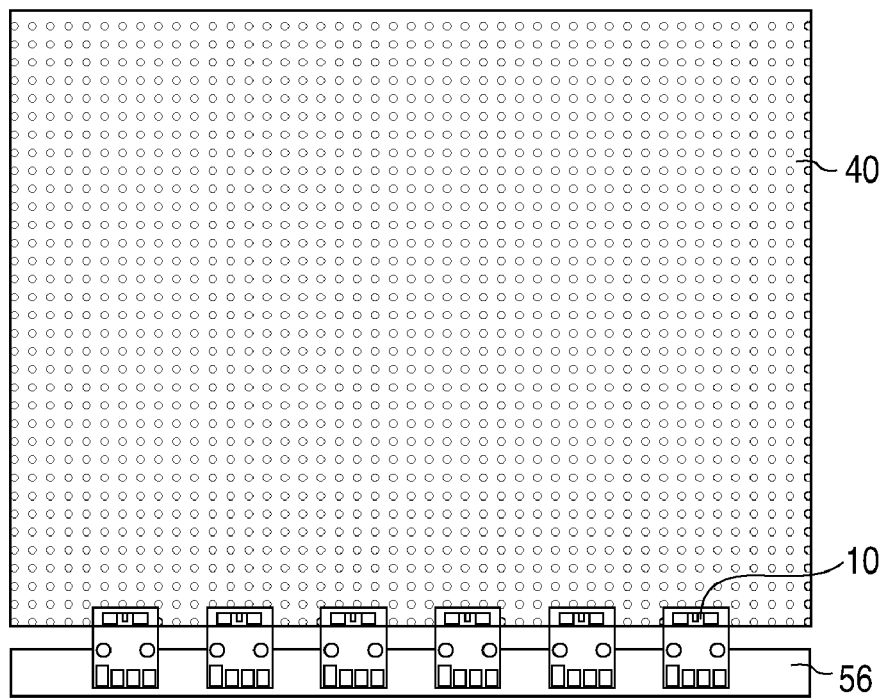
FIG. 10 is a plan view of LEDs mounted on a flexible circuit board and optically connected to a waveguide.

In the device illustrated in FIG. 10, rather than each LED being individually connected to waveguide 40 as in FIGS. 5 and 9, the LEDs 10 are connected to a flexible circuit board 56, then positioned in openings in waveguide 40. Since circuit board 56 is flexible, if the shape of waveguide 40 changes, circuit board 56 can flex, therefore any stress on individual LEDs 10 is reduced relative to LEDs mounted on a rigid board.

Figure 11:
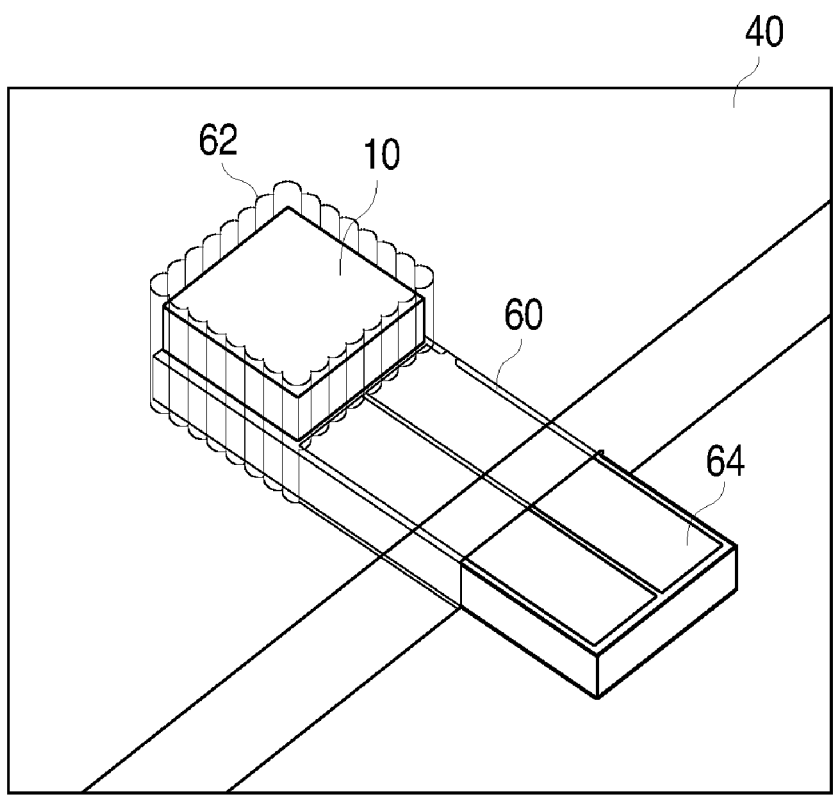
FIG. 11 is a perspective view of an LED press fit into a waveguide.
Figure 12:
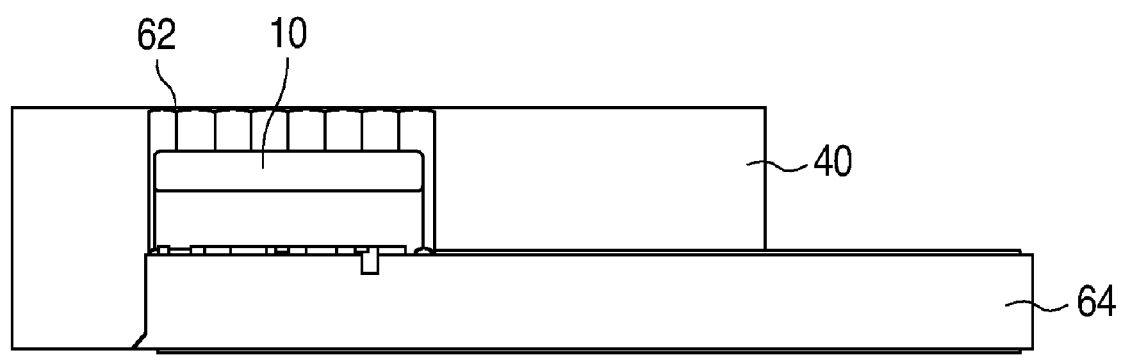
FIG. 12 is a cross sectional view of the device illustrated in FIG. 11.

FIGS. 11 and 12 illustrate an LED press fit into a waveguide. An opening 42 is formed in waveguide 40 to accommodate LED 10. As illustrated in FIG. 11, opening 62 may have walls with varying angles to refract and reflect the light emitted by LED 10 at different angles, such that the light is mixed to create uniform emission. The scallop shape of the walls is only one of many suitable shapes for the walls, and the number of scallops along each wall is not critical.

A groove 60 in waveguide 40 accommodates mount 64 on which LED 10 is mounted. Mount 64 may replace mount 22, shown in FIG. 1, or mount 22 may be mounted on mount 64. In some embodiments, mount 64 is close-sawn to the edges of LED 10, as illustrated in FIG. 11. Mount 64 may be press fit into groove 60, such that no adhesive is required, or glued into groove 60. For a given waveguide thickness, LED 10 is closer to the top of waveguide 40 than in the embodiments illustrated in FIGS. 5 and 9, which may improve coupling of light from LED 10 into waveguide 40.

In some embodiments, the features illustrated in various figures may be combined. As an example, an LED may be press fit as illustrated in FIGS. 11 and 12 into a waveguide section that is placed in a slot in a larger waveguide, as illustrated in FIG. 5.

The embodiments described above may be used as a backlight for an LCD display. In a finished display, a thin diffuser film may be affixed over the top surface of the waveguide 40 to diffuse the light. A brightness enhancement film (BEF) may be disposed over the diffuser film to redirect light to within a relatively small angle directly in front of the waveguide 40 to increase the brightness in the normal viewing direction. A conventional color or monochrome LCD is then disposed over waveguide 40. The LCD can produce color images using pixel shutters (e.g., a liquid crystal layer in combination with a TFT array), polarizers, and RGB filters. Such LCDs are well known.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
   a semiconductor light emitting device comprising:
      a semiconductor structure comprising a light emitting layer disposed between an n-type region and a p-type region;
      a first contact electrically connected to the n-type region;
      a second contact electrically connected to the p-type region, wherein the first and second contacts are formed on a first side of the semiconductor structure such that the semiconductor structure is a flip chip;
      a reflector disposed over a second side of the semiconductor structure, substantially parallel to the major surface of the light emitting layer, such that a majority of light exiting the light emitting device exits through side surfaces of the light emitting device;
   a mount, wherein the semiconductor light emitting device is attached to the mount;
   a transparent member comprising:
      an opening in which at least a portion of the light emitting device is positioned; and
      a groove in which at least a portion of the mount is positioned;
      wherein at least a portion of light exiting the sides of the light emitting device is optically coupled into the transparent member; and
      wherein the mount is connected to the transparent member by a press fit between the mount and the groove.

2. The structure of claim 1 wherein the opening in the transparent member has sidewalls, at least one sidewall having varying angles along a length of the sidewall to vary a refraction of light along the sidewall.

3. The structure of claim 1 wherein a depth of the opening is greater than a depth of the groove.

4. The structure of claim 1 further comprising a gap between an edge of the opening and a side of the light emitting device.

5. The structure of claim 1 wherein the semiconductor light emitting device is a first semiconductor light emitting device, the structure further comprising:
   at least one additional semiconductor light emitting device;
   the transparent member having at least one additional opening in which at least a portion of the at least one additional semiconductor light emitting device is positioned; and
   a flexible circuit board to which the first semiconductor light emitting device and the at least one additional semiconductor light emitting device are physically and electrically connected.

* * * * *